(12) United States Patent
Srinivasan et al.

(10) Patent No.: US 8,514,117 B2
(45) Date of Patent: Aug. 20, 2013

(54) EXCESS LOOP DELAY COMPENSATION FOR A CONTINUOUS TIME SIGMA DELTA MODULATOR

(75) Inventors: Venkatesh Srinivasan, Dallas, TX (US); Patrick Satarzadeh, Addison, TX (US); Victoria W. Limetkai, Dallas, TX (US); Baher Haroun, Allen, TX (US); Marco Corsi, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 81 days.

(21) Appl. No.: 13/229,462

(22) Filed: Sep. 9, 2011

(65) Prior Publication Data

US 2013/0063291 A1   Mar. 14, 2013

(51) Int. Cl.
*H03M 3/00* (2006.01)

(52) U.S. Cl.
USPC ........... 341/143; 375/130; 375/142; 375/344; 365/76; 330/10; 341/155; 341/150; 341/140; 327/172; 327/175

(58) Field of Classification Search
USPC ................... 341/143–55; 375/130, 142, 344; 365/76; 330/10; 327/172–175
See application file for complete search history.

(56) References Cited

U.S. PATENT DOCUMENTS

| | | | | |
|---|---|---|---|---|
| 4,982,827 | A | * | 1/1991 | Seitz et al. ............... 198/341.07 |
| 5,652,586 | A | * | 7/1997 | Chuh et al. ................... 341/155 |
| 5,729,230 | A | | 3/1998 | Jensen et al. |
| 5,768,321 | A | * | 6/1998 | Watanabe et al. ............. 375/344 |
| 5,917,369 | A | * | 6/1999 | Nguyen .......................... 330/10 |
| 5,995,538 | A | * | 11/1999 | Lomp ............................ 375/142 |
| 6,088,255 | A | * | 7/2000 | Matsuzaki et al. ............... 365/76 |
| 6,175,586 | B1 | * | 1/2001 | Lomp ............................ 375/130 |
| 6,414,615 | B1 | | 7/2002 | Cheng |
| 7,405,687 | B2 | | 7/2008 | Mitteregger et al. |
| 7,880,654 | B2 | | 2/2011 | Oliaei et al. |
| 8,228,105 | B2 | * | 7/2012 | McLeod et al. ................ 327/175 |

OTHER PUBLICATIONS

"A 20mW 61dB SNDR (60MHz BW) 1b 3rd-Order Continuous-Time Delta-Sigma Modulator Clocked at 6GHz in 45nm CMOS," IEEE International Solid-State Circuits Conference, 2012, pp. 21-23 (Srinivasan, et al.).

* cited by examiner

*Primary Examiner* — Lam T Mai
(74) *Attorney, Agent, or Firm* — Alan A. R. Cooper; Wade J. Brady, III; Frederick J. Telecky, Jr.

(57) ABSTRACT

A method and corresponding apparatus are provided. In operation, an analog signal is integrated with an integrator to generate an integrated analog signal. The integrated analog signal is compared, in synchronization with a first clock signal and a second clock signal, to a reference voltage with a plurality of comparators to generate a comparator output signal. A feedback current is then generated, in synchronization with the second clock signal, from the comparator output signal. The feedback current is fed back to at least one of the comparators, and the comparator output signal is latched in synchronization with the first clock signal to generate a latched output signal. This latched output signal is converted to a feedback analog signal, and a difference between the analog signal and the feedback analog signal is determined.

20 Claims, 5 Drawing Sheets

EXCESS LOOP DELAY COMPENSATION FOR A CONTINUOUS TIME SIGMA DELTA MODULATOR

TECHNICAL FIELD

The invention relates generally to a sigma delta modulator (SDM) and, more particularly, to excess loop delay (ELD) for an SDM.

BACKGROUND

Turning to FIG. 1, a conventional SDM 100 can be seen. This SDM 100 generally comprises an integrator pipeline 114 (which generally includes stage 112-1 to 112-N coupled in series with one another), a comparator 106, and a latch 108. Each of the stages 112-1 to 112-N generally comprises an adder 102-1 to 102-N (which is typically a node for a single-ended SDM and a pair of nodes for a differential SDM), an integrator 104-1 to 104-N, and a digital-to-analog converter (DAC) 110-1 to 110-N. In operation, the integrator pipeline 114 (which helps to form an N-th order SDM) generally integrates the analog signal IN so that the comparator 106 can compare the integrated analog signal IN to one or more reference voltages. Typically, comparator 106 is comprised of several latched comparators arranged as a flash analog-to-digital converter (ADC) that perform the comparison(s) in synchronization with the clocks signal CLK (where each comparator receives at least one of the reference voltages). Usually, however, the output(s) of comparator 106 are not fully resolved digital signals, so latch 108 (which is clocked by or latches in synchronization with the inverse of the clock signal CLK) can generate fully resolved digital signals (i.e., rail-to-rail signals). The output from the latch can then be fed back to the stages 112-1 to 112-N so that these digital output(s) can be converted to analog signals and subtracted at adders 102-1 to 102-N. There are some drawbacks to this arrangement; namely, parasitic poles and/or unaccounted for excess delay (which may exist due to parasitic poles or paths) can lead to unstable behavior. Therefore, there is a need for an improved SDM.

Some other conventional circuits are: U.S. Pat. Nos. 5,729, 230 6,414,615; 7,405,687; and U.S. Pat. No. 7,880,654.

SUMMARY

An embodiment of the present invention, accordingly, provides an apparatus. The apparatus comprises an adder having a first input and a second input, wherein the adder determines a difference between the first and second inputs; an integrator having an input and an output, wherein the input of the integrator is coupled to the adder; a first comparator having an input and an output, wherein the input of the first comparator is coupled to the output of the integrator, and wherein the first comparator is clocked by a first clock signal; a second comparator having an input and an output, wherein the input of the second comparator is coupled to the output of the first comparator, and wherein the second comparator is clocked by a second clock signal; a latch having an input and an output, wherein the input of the latch is coupled to the output of the second comparator, wherein the latch is clocked by the first clock signal; a track-and-hold (T/H) circuit having an input and an output, wherein the input of the T/H circuit is coupled to the output of the second comparator, and wherein the output of the T/H circuit is coupled to the input of the first comparator, and wherein the T/H circuit is controlled by the second clock signal; and a digital-to-analog converter (DAC) having an input and an output, wherein the input of the DAC is coupled to the output of the latch, and wherein the output of the DAC is coupled to the second input of the adder.

In accordance with an embodiment of the present invention, the second clock signal is an inverse of the first clock signal.

In accordance with an embodiment of the present invention, the inputs and outputs of each of the adder, integrator, comparator, latch, T/H circuit, and DAC are differential.

In accordance with an embodiment of the present invention, the adder further comprises a pair of nodes.

In accordance with an embodiment of the present invention, the T/H circuit further comprises a T/H cell having: a pair of input switches that are activated and deactivated by the second clock signal and that are coupled to the output of the comparator; and a current steering circuit that is coupled to the input of comparator and the pair of input switches.

In accordance with an embodiment of the present invention, the current steering circuit further comprises: a pair of transistors, wherein each transistor is coupled to the input of the comparator, and wherein each transistor is coupled to at least one of the pair of input switches; and a current source that is coupled to each of the transistors.

In accordance with an embodiment of the present invention, each transistor further comprises an NMOS transistor.

In accordance with an embodiment of the present invention, the comparator further comprises a plurality of latched comparators arranged as a flash analog-to-digital converter (ADC).

In accordance with an embodiment of the present invention, an apparatus is provided. The apparatus comprises an integrator pipeline having a plurality of stages coupled in series with one another, wherein each stage includes: an adder; an integrator that is coupled to the adder; and a DAC that is coupled to the adder; a first comparator having an input and an output, wherein the input of the first comparator is coupled to the output of the integrator pipeline, and wherein the first comparator is clocked by a first clock signal; a second comparator having an input and an output, wherein the input of the second comparator is coupled to the output of the first comparator, and wherein the second comparator is clocked by a second clock signal; a latch having an input and an output, wherein the input of the latch is coupled to the output of the comparator, and wherein the output of the latch is coupled to the DAC from each stage, wherein the latch is clocked by the first clock signal; a T/H circuit having an input and an output, wherein the input of the T/H circuit is coupled to the output of the second comparator, and wherein the output of the T/H circuit is coupled to the input of the first comparator, and wherein the T/H circuit is controlled by the second clock signal.

In accordance with an embodiment of the present invention, the inputs and outputs of each of the adder, comparator, latch, and T/H circuit are differential.

In accordance with an embodiment of the present invention, the comparator further comprises a plurality of latched comparators arranged as a flash ADC, and wherein the output of the comparator further comprises a plurality of outputs.

In accordance with an embodiment of the present invention, a method is provided. The method comprises integrating an analog signal with an integrator to generate an integrated analog signal; comparing, in synchronization with a first clock signal and a second clock signal, the integrated analog signal to a reference voltage with a plurality of comparators to generate a comparator output signal; generating a feedback current, in synchronization with the second clock signal, from the comparator output signal; providing the feedback current back to at least one of the comparators; latching the comparator output signal in synchronization with the first clock signal to generate a latched output signal; converting the latched output signal to a feedback analog signal; and determining a difference between the analog signal and the feedback analog signal.

In accordance with an embodiment of the present invention, the comparator output signal further comprises a plurality of comparator output signals, and wherein the reference voltage further comprises a plurality of reference voltages, and wherein the step of comparing further comprises comparing the integrated analog signal to each of the reference signals to generate the plurality of comparator output signals.

In accordance with an embodiment of the present invention, the step of amplifying further comprises: actuating a plurality of switched in synchronization with the second clock signal, wherein each switch is associated with at least one of the comparator output signals; and applying each of the comparator output signal to at least one of a plurality of current steering circuits.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
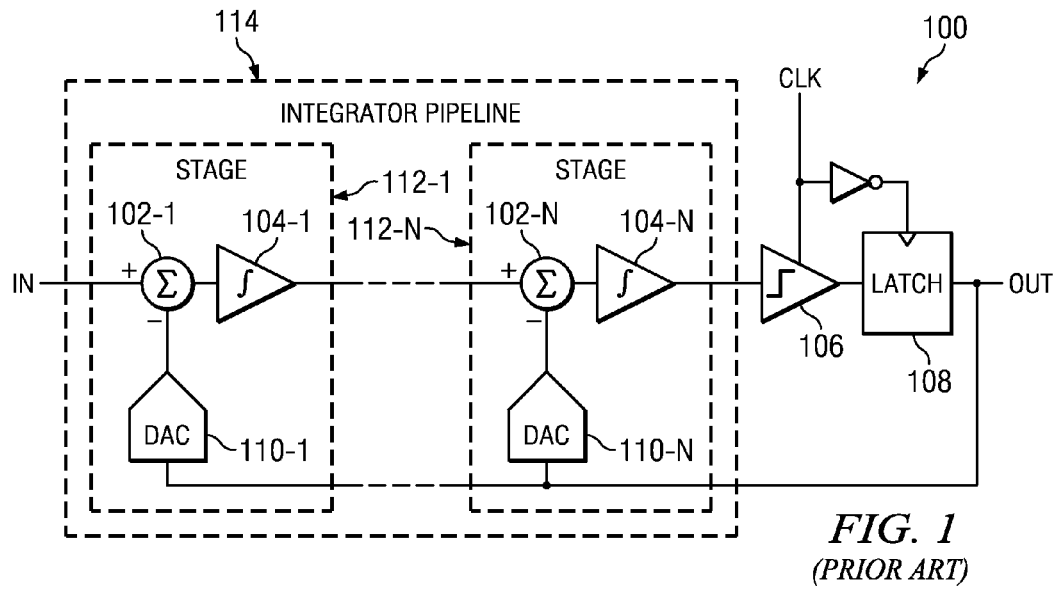
FIG. 1 is a diagram of an example of a conventional SDM.

Refer now to the drawings wherein depicted elements are, for the sake of clarity, not necessarily shown to scale and wherein like or similar elements are designated by the same reference numeral through the several views.

Figure 2:
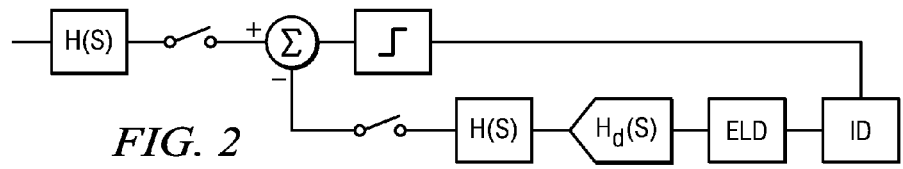
FIGS. 2-10 are diagrams corresponding to a model of an SDM.

To understand some of the problems associated with SDM 100, an analysis of the performance can be performed. Since SDM 100 is a continuous time SDM, there is an inherent difficulty in analyzing its performance because sampling is performed within the feedback loop of the SDM 100. Thus, a discrete time SDM equivalent model, as shown in FIG. 2, can be used, and, further for the sake of simplicity of analysis, comparator 106 can be a 1-bit comparator. In this model, H(s) represent a filter corresponding to integrators (i.e., integrator pipeline 114), while $H_d(s)$ represents a filter corresponding to a DAC (i.e., 110-1). Additionally, because there are delays within the loop, blocks ELD and ID (which generally correspond to Excess Loop Delay and Inserted Delay) are also included. As a result of this configuration, the impulse response G(z) (in the z-domain) for the loop is:

$$G(z) = Z\{h(t) * h_d(t)|_{t=nTs}\} \quad (1)$$

where h(t) and $h_d(t)$ are the impulse responses (in the time domain) associated with the H(s) and $H_d(s)$ blocks, respectively, and where the Ts is the sample period (which is assumed to be equal to 1 as an example and for the sake of simplicity.

Figure 3:
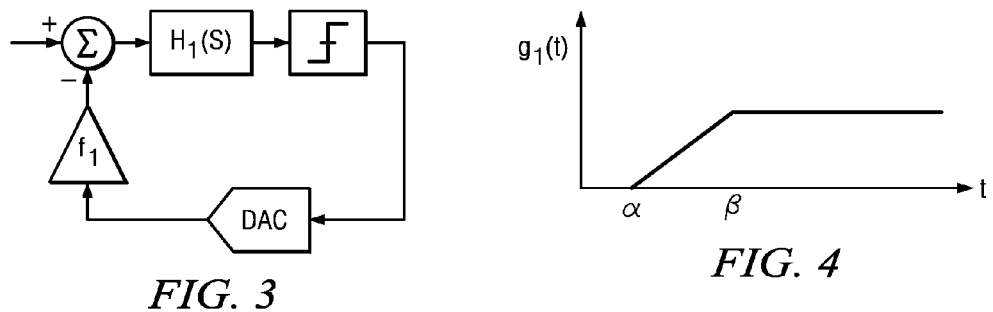
Figure 4:
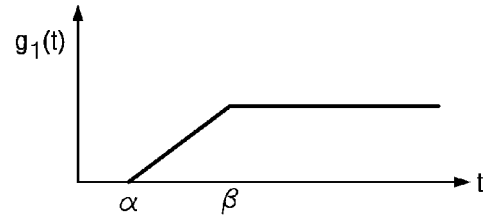

Turning to FIGS. 3 and 4, one can begin to examine the introduction of delays into the loop of FIG. 2. In this example, a feedback $f_1$ is introduced between the DAC and adder, resulting in an impulse response $g_1(t)$ for the loop of FIG. 3 being:

$$g_1(t) = h_1(t) * h_{DAC}(t), \quad (2)$$

which can be seen in FIG. 4. The noise transfer function NTF(z) (in the z-domain) is also:

$$NTF(z) = \frac{1}{1 + f_1 G_1(z)}. \quad (3)$$

Under the circumstances where the end of the DAC pulse is less than one sampling period Ts (i.e., $0 \leq \alpha < 1$, $\alpha < \beta \leq 1$), the resulting impulse response $G_1(z)$ (in the z-domain) for the loop of FIG. 3 is:

$$G_1(z) = \frac{(\beta - \alpha)z^{-1}}{1 - z^{-1}}, \quad (4)$$

yielding a noise transfer function NTF(z) of:

$$NTF(z) = \frac{1 - z^{-1}}{1 - z^{-1} + f_1(\beta - \alpha)z^{-1}}, \quad (5)$$

Thus, to achieve a desired noise transfer function NTF(z) of $1-z^{-1}$, the feedback $f_1$ would be:

$$f_1 = \frac{1}{\beta - \alpha}. \quad (6)$$

When the end of the DAC pulse exceeds one sampling period Ts (i.e., $0 < \alpha < 1$, $\beta > 1$), the resulting impulse response $G_1(z)$ (in the z-domain) for the loop of FIG. 3 is:

$$G_1(z) = \frac{(1 - \alpha)z^{-1} - (1 - \beta)z^{-2}}{1 - z^{-1}}, \quad (7)$$

yielding a noise transfer function NTF(z) of:

$$NTF(z) = \frac{1 - z^{-1}}{1 - z^{-1} + f_1(1-\alpha)z^{-1} - f_1(1-\beta)z^{-2}}, \quad (8)$$

where no feedback $f_1$ satisfies the condition of having the noise transfer function NTF(z) to be $1-z^{-1}$ because the order of the impulse response $G_1(z)$ for the loop of FIG. 3 increases by one when the end of the DAC pulse exceeds one sampling period. Thus, the feedback $f_1$ introduces a delay which cannot be compensated for without additional circuitry when the end of the DAC pulse is greater than one sampling period Ts.

Figure 5:
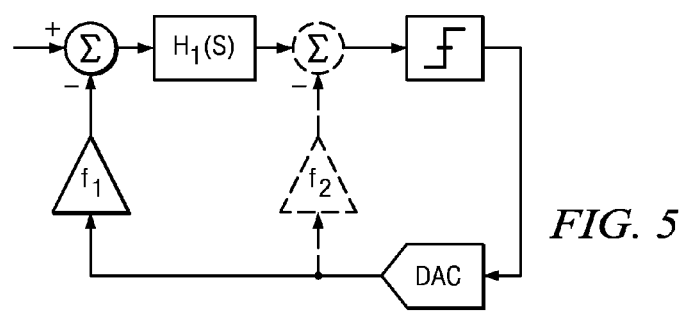
Figure 6:
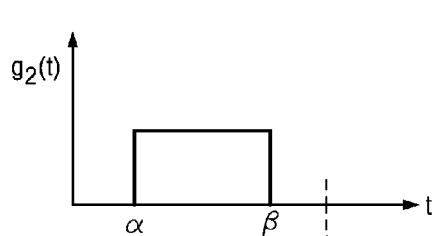

To address this issue, an additional feedback $f_2$ can be introduced prior to the comparator (as shown in FIG. 5). The impulse response $g_2(t)$ for this "inner loop" is then:

$$g_2(t) = h_{DAC}(t), \quad (9)$$

which can be seen in FIG. 6. Under the circumstances where the end of the DAC pulse is less than one sampling period Ts such that $\alpha=0$ and $\beta\leq 1$, the resulting impulse response $G_2(z)$ (in the z-domain) for "inner loop" of FIG. 5 is:

$$G_2(z)=1, \quad (9)$$

This means that the total noise transfer function NTF(z) (in the z-domain) is:

$$NTF(z) = \frac{1}{1 + f_1 G_1(z) + f_2 G_2(z)} = \quad (10)$$

$$\frac{1 - z^{-1}}{1 - z^{-1} + f_1(\beta-\alpha)z^{-1} + f_2(1-z^{-1})}.$$

So, to achieve a desired noise transfer function NTF(z) of $1-z^{-1}$, the feedbacks $f_1$ and $f_2$ would be:

$$f_1 = \frac{1}{\beta - \alpha}. \quad (11)$$

$$f_2 = 0. \quad (12)$$

Where the end of the DAC pulse is less than one sampling period Ts such that $0<\alpha<1$ and $\alpha<\beta\leq 1$, the resulting impulse response $G_2(z)$ (in the z-domain) for the "inner loop" of FIG. 5 is:

$$G_2(z)=0, \quad (13)$$

which would again lead to the feedbacks $f_1$ and $f_2$ being:

$$f_1 = \frac{1}{\beta - \alpha}. \quad (14)$$

$$f_2 = 0. \quad (15)$$

As it can be directly observed, because feedback $f_2$ is zero, no information is provided by the "inner loop" when the end of the DAC pulse is less than one sampling period Ts. This means that the "inner loop" of FIG. 5 would not affect the performance of the "outer loop" of FIG. 5 when the end of the DAC pulse is less than one sampling period Ts.

For the case where the end of the DAC pulse exceeds one sampling period Ts, however, the "inner loop" does provide information to allow for compensation. For this case, the resulting impulse response $G_2(z)$ (in the z-domain) for "inner loop" of FIG. 5 is:

$$G_2(z)=z^{-1}, \quad (16)$$

yielding a total noise transfer function NTF(z) (in the z-domain) of:

$$NTF(z) = \frac{1}{1 + f_1 G_1(z) + f_2 G_2(z)} = \quad (17)$$

$$\frac{1 - z^{-1}}{1 - z^{-1} + f_1(1-\alpha)z^{-1} - f_1(1-\beta)z^{-2} + f_1 z^{-1}(1-z^{-1})}.$$

To achieve a desired noise transfer function NTF(z) of $1-z^{-1}$, the feedbacks $f_1$ and $f_2$ would be:

$$f_1 = \frac{1}{\beta - \alpha}. \quad (18)$$

$$f_2 = \frac{\beta - 1}{\beta - \alpha}. \quad (19)$$

Thus, feedback $f_2$ provides an extra degree of freedom that allows for compensation of the delay within the "outer loop" of FIG. 5, meaning that the "inner loop" can provide compensation when the "outer loop" cannot.

Figure 7:
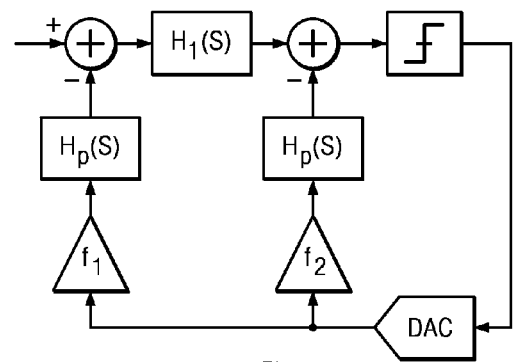
Figure 8:
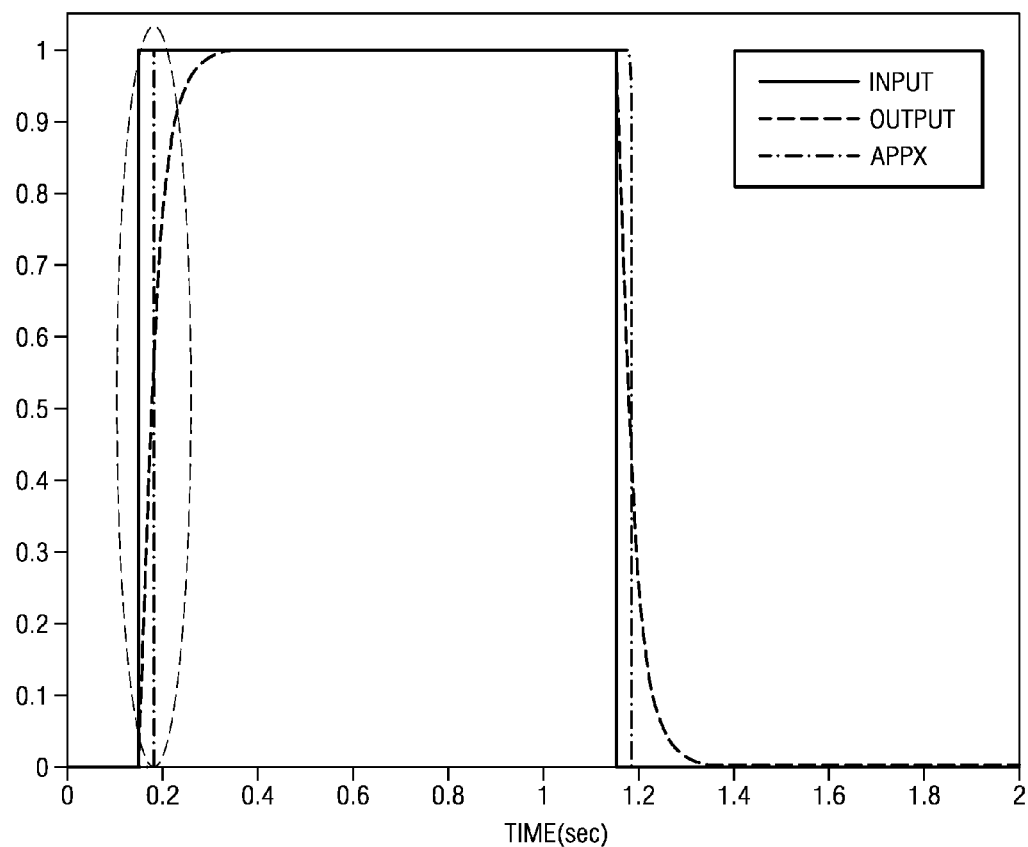
Figure 9:
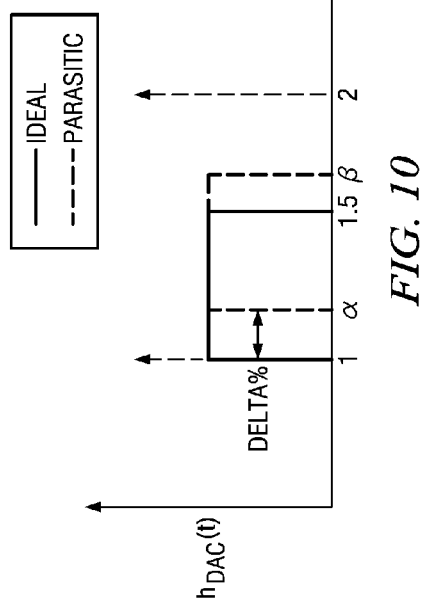
Figure 10:
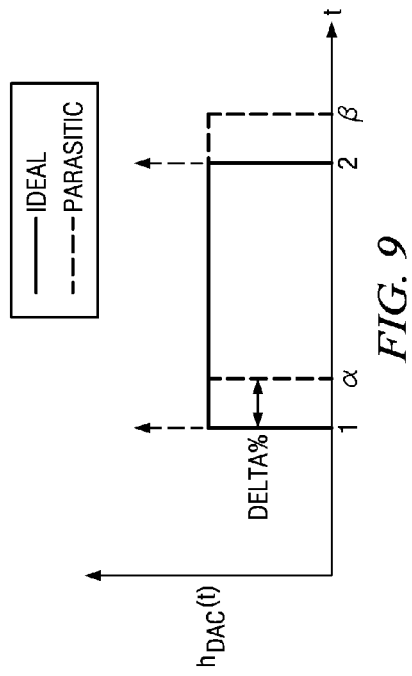

A problem with this arrangement, however, is that the SDM of FIG. 5 becomes unstable when unaccounted for poles exist with feedbacks $f_1$ and $f_2$. These poles will be present, and can be modeled (as shown in FIG. 7) by introducing filters $H_p(s)$, which represent the parasitic poles. With a small delay (i.e., about 3% of the sample period), a parasitic path modeled as extra delay in the feedback path can be observed in FIG. 8. The reason for this instability can be seen in FIGS. 9 and 10 (which are for non-return-to-zero (NRZ) and/or return-to-zero (RZ) DACs, respectively). For the NRZ case of FIG. 9, the feedback (broken line) arrives too late, so the "inner loop" can no longer perform the compensation. For the RZ case of FIG. 10, no feedback exists at the sampling instants, so the "inner loop" has almost no effect. Ultimately, the pulse is missing at one clock delay, which indicates that the delay for the "inner loop" should be shorter than one clock period.

Figure 11:
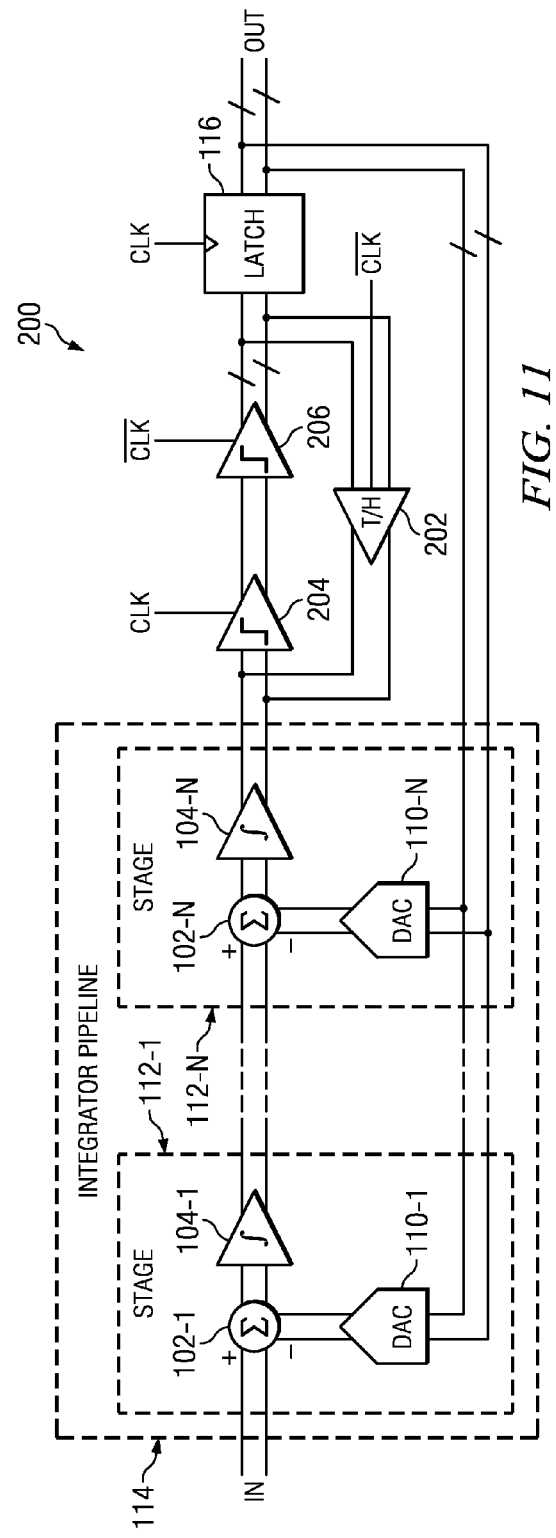
FIG. 11 is a diagram of an example of an SDM in accordance with an embodiment of the invention.
Figure 12:
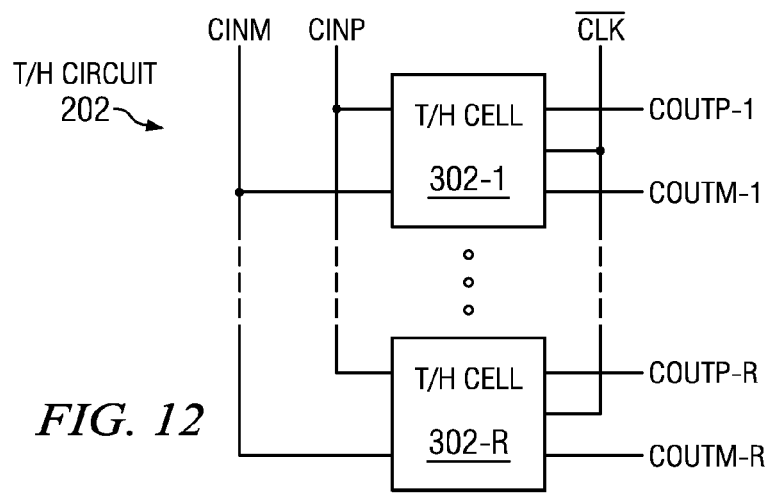
FIG. 12 is a diagram of an example of the track-and-hold (T/H) circuit of FIG. 11.
Figure 13:
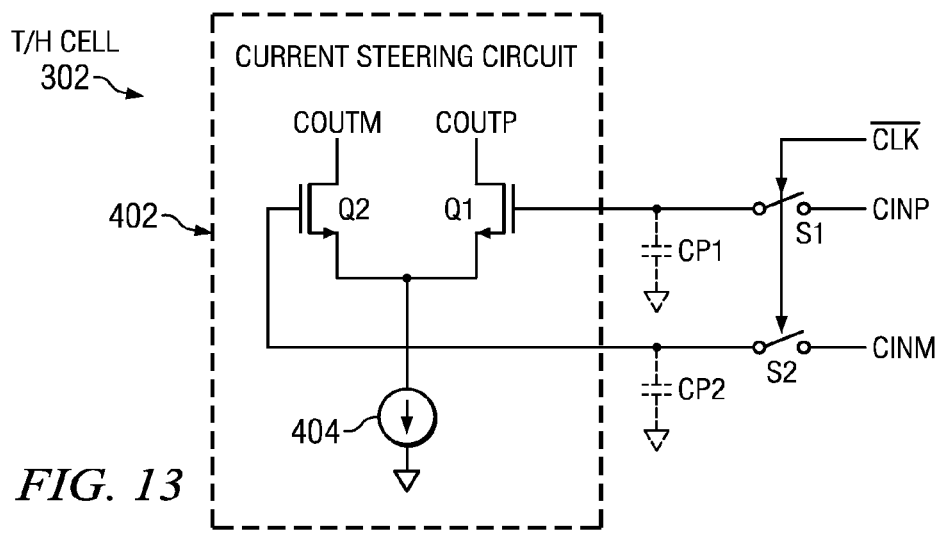
FIG. 13 is a diagram of an example of an T/H cell of FIG. 12.

Turning now to FIG. 11, an SDM 200 with an embodiment in accordance with the present invention can be seen. As shown, SDM 200 includes many of the same components as SDM 100, except that SDM includes feedback "inner loop" (which generally corresponds to the feedback $f_2$ of FIGS. 5 and 7). This feedback "inner loop" is generally comprised of an T/H circuit 202 that receives the inverse of the clock signal CLK such that is transparent when the clock signal CLK is logic low or "0." Because of the instability introduced by using a full clock delay (at the output of latch 116). This "inner loop" is coupled between the input of comparator 204 and output of the comparator 206 (which may be a flash ADC having pipelined comparators clocked off opposite clock edges). This T/H circuit 202 (as shown in FIG. 12) is generally comprised of a number of T/H cells 302-1 to 302-R (where each cell is coupled to an output of comparator 206 so as to respectively receive comparator output signals COUTP- 1/COUTM-1 to COUTP-R/COUTM-R). Each cell 302-1 to 302-R is then coupled to the input terminals of the comparator 204 so as to provide feedback signal CINM and CINP. Each cell 302-1 to 302-R (herein after 302), as shown in FIG. 13, generally comprises a pair of switches S1 and S2 (or a signal switch for a signal-ended SDM) and a current steering circuit 402, and the current steering circuit 402 generally comprises transistors Q2 and Q1 (which can, for example, be NMOS transistors) and a current source 404.

Generally, at the end of a half-cycle of the clock signal CLK, the comparators 204 and 206 do not provide fully resolved digital signals, so, when the inverse of the clock signal or clockbar signal $\overline{CLK}$ activates the switches (i.e., S1 and S2), a partially resolved differential signal COUTP and COUTM is provided. Each of the input switches S1 and S2 includes a parasitic capacitance CP1 and CP2, which can function as the sampling capacitors for the partially resolved (or fully resolved in some cases) differential signal COUTP and COUTM. In general, however, the outputs from comparator 206 will be fully resolved, while comparator 204 will not produce fully resolved digital signals. By placing the T/H circuit 202 after comparator 206, when the clockbar signal $\overline{CLK}$ transitions to logic high or "1," the SDM 200 will begin with a small non-full scale signal and most of the time resolve to a full-scale signal. But, under some circumstances, there may not be full resolution. Because (in these case) the differential signal COUTP and COUTM may not fully resolved (meaning that the inputs to the T/H circuit 202 may range from low amplitude analog levels to full resolved digital levels), the current steering circuit 402 functions as a transconductance amplifier, so, even with very small (analog level) signals output from comparator 206, some information can be fed back via the T/H circuit 202, which is contrary to conventional systems that expect full resolved (digital level) signals to generate feedback currents. Thus, T/H circuit 202 is able to provide feedback (i.e., feedback $f_2$) to compensate for loop delay or to provide ELD compensation.

Figure 15:
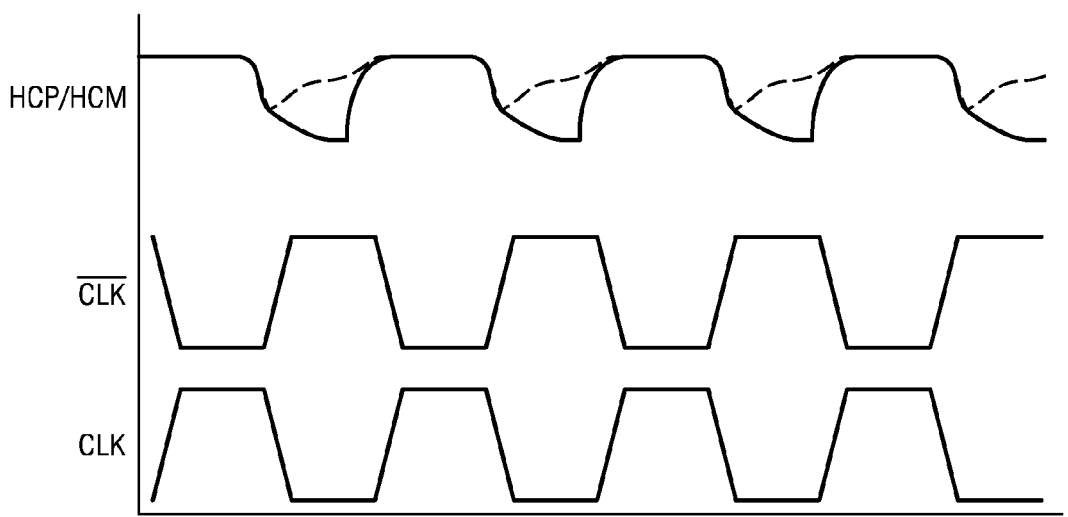
FIGS. 14 and 15 are a more detailed example of ELD compensation circuitry.
Figure 14:
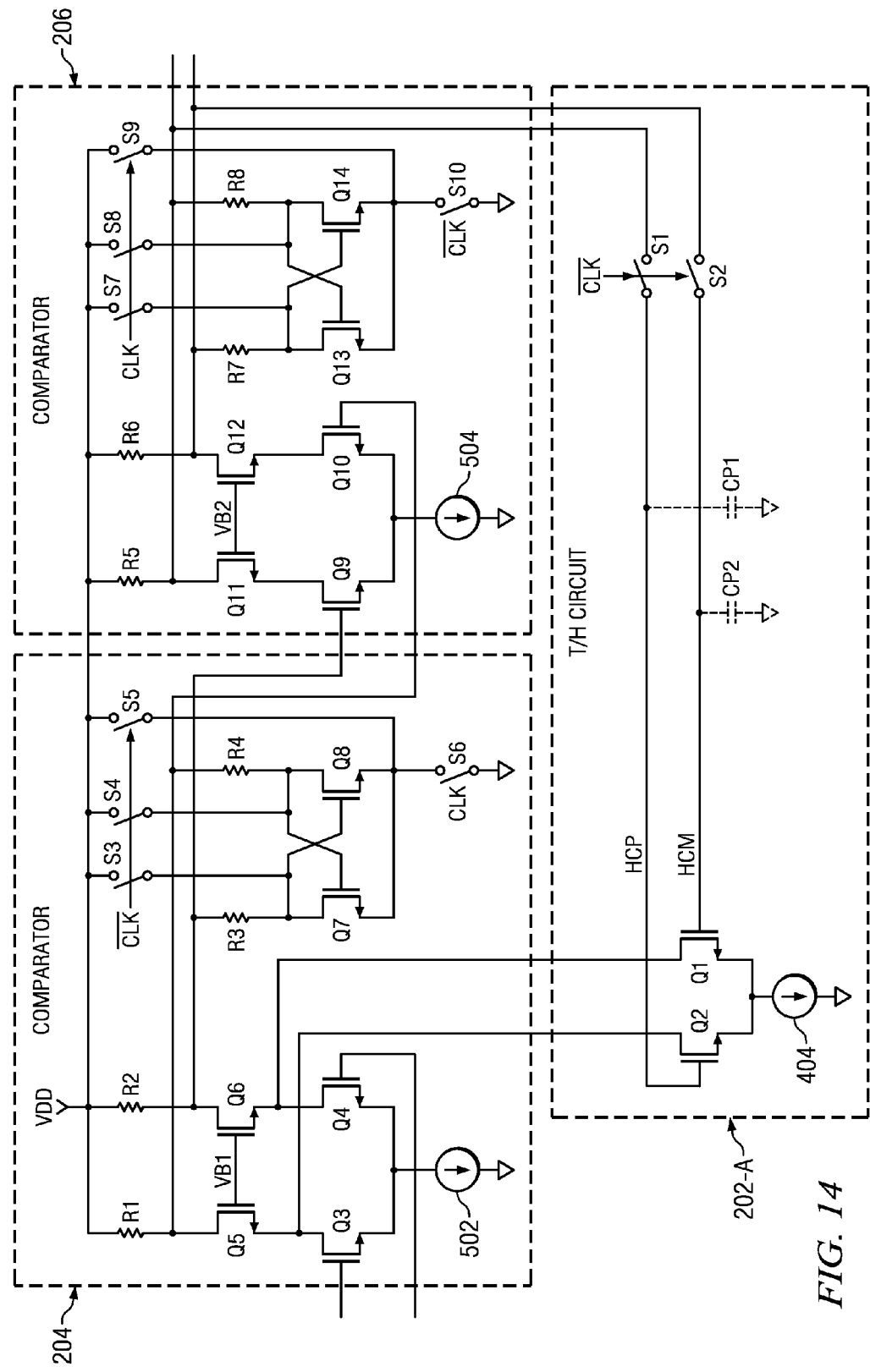

Turning to FIGS. 14 and 15, a more detailed example of ELD compensation circuitry (namely comparators 204 and 206 and T/H circuit 202-A) can be seen. In this example, the T/H circuit 202 (which is labeled 202-A) is generally comprised of a single T/H cell that includes transistors Q1 and Q2, parasitic capacitors CP1 and CP2, switches S1 and S2, and current source 404 (which are described in detail above). Comparators 204 and 206 are each generally comprised of a preamplifier (transistors Q3 to Q6, current source 502, and resistors R1 and R2 for comparator 204 and transistors Q9 to Q11, current source 504, and resistors R5 and R6 for comparator 206) and a latch (transistors Q7 and Q8, resistors R3 and R4, and switches S3 to S6 for comparator 204 and transistors Q13 and Q14, resistors R7 and R8, and switches S7 to S10 for comparator 206. As shown when the clock signal CLK transitions to logic low, the input to comparator 204 is amplified while its latch is reset; the same is true for comparator 206 when the clockbar signal $\overline{CLK}$ transitions to logic low. Then, when the clock signal CLK transitions to logic high for comparator 204 (or, similar when clockbar signal $\overline{CLK}$ transitions to logic high for comparator 206), the comparator 204 (or comparator 206) enters regeneration, and ELD compensation is provided through the cascode nodes of the preamplifier of comparator 204.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   an adder having a first input and a second input, wherein the adder determines a difference between the first and second inputs;
   an integrator having an input and an output, wherein the input of the integrator is coupled to the adder;
   a first comparator having an input and an output, wherein the input of the first comparator is coupled to the output of the integrator, and wherein the first comparator is clocked by a first clock signal;
   a second comparator having an input and an output, wherein the input of the second comparator is coupled to the output of the first comparator, and wherein the second comparator is clocked by a second clock signal;
   a latch having an input and an output, wherein the input of the latch is coupled to the output of the second comparator, wherein the latch is clocked by the first clock signal;
   a track-and-hold (T/H) circuit having an input and an output, wherein the input of the T/H circuit is coupled to the output of the second comparator, and wherein the output of the T/H circuit is coupled to the input of the first comparator, and wherein the T/H circuit is controlled by the second clock signal; and
   a digital-to-analog converter (DAC) having an input and an output, wherein the input of the DAC is coupled to the output of the latch, and wherein the output of the DAC is coupled to the second input of the adder.

2. The apparatus of claim 1, wherein the second clock signal is an inverse of the first clock signal.

3. The apparatus of claim 2, wherein the inputs and outputs of each of the adder, integrator, the first comparator, the second comparator, the latch, the T/H circuit, and the DAC are differential.

4. The apparatus of claim 3, wherein the adder further comprises a pair of nodes.

5. The apparatus of claim 3, wherein the T/H circuit further comprises a T/H cell having:
   a pair of input switches that are activated and deactivated by the second clock signal and that are coupled to the output of the comparator; and
   a current steering circuit that is coupled to the input of comparator and the pair of input switches.

6. The apparatus of claim 5, wherein the current steering circuit further comprises:
   a pair of transistors, wherein each transistor is coupled to the input of the comparator, and wherein each transistor is coupled to at least one of the pair of input switches; and
   a current source that is coupled to each of the transistors.

7. The apparatus of claim 6, wherein each transistor further comprises an NMOS transistor.

8. The apparatus of claim 6, wherein the comparator further comprises a plurality of latched comparators arranged as a flash analog-to-digital converter (ADC).

9. An apparatus comprising:
   an integrator pipeline having a plurality of stages coupled in series with one another, wherein each stage includes:
      an adder;
      an integrator that is coupled to the adder; and
      a DAC that is coupled to the adder;
   a first comparator having an input and an output, wherein the input of the first comparator is coupled to the output of the integrator pipeline, and wherein the first comparator is clocked by a first clock signal;

a second comparator having an input and an output, wherein the input of the second comparator is coupled to the output of the first comparator, and wherein the second comparator is clocked by a second clock signal;

a latch having an input and an output, wherein the input of the latch is coupled to the output of the comparator, and wherein the output of the latch is coupled to the DAC from each stage, wherein the latch is clocked by the first clock signal; and a T/H circuit having an input and an output, wherein the input of the T/H circuit is coupled to the output of the second comparator, and wherein the output of the T/H circuit is coupled to the input of the first comparator, and wherein the T/H circuit is controlled by the second clock signal.

10. The apparatus of claim 9, wherein the second clock signal is an inverse of the first clock signal.

11. The apparatus of claim 10, wherein the inputs and outputs of each of the adder, the first comparator, the second comparator, the latch, and the T/H circuit are differential.

12. The apparatus of claim 11, wherein the adder further comprises a pair of nodes.

13. The apparatus of claim 11, wherein the comparator further comprises a plurality of latched comparators arranged as a flash ADC, and wherein the output of the comparator further comprises a plurality of outputs.

14. The apparatus of claim 13, wherein the T/H circuit further comprises a plurality of T/H cells, wherein each T/H cell is coupled to at least one of the outputs of the comparator, and wherein each T/H cell includes:

a pair of input switches that are activated and deactivated by the second clock signal; and a current steering circuit that is coupled to the input of comparator and the pair of input switches.

15. The apparatus of claim 14, wherein the current steering circuit further comprises:

a pair of transistors, wherein each transistor is coupled to the input of the comparator, and wherein each transistor is coupled to at least one of the pair of input switches; and a current source that is coupled to each of the transistors.

16. The apparatus of claim 15, wherein each transistor further comprises an NMOS transistor.

17. A method comprising:

integrating an analog signal with an integrator to generate an integrated analog signal;

comparing, in synchronization with a first clock signal and a second clock signal, the integrated analog signal to a reference voltage with a plurality of comparators to generate a comparator output signal;

generating a feedback current, in synchronization with the second clock signal, from the comparator output signal;

providing the feedback current back to at least one of the comparators;

latching the comparator output signal in synchronization with the first clock signal to generate a latched output signal;

converting the latched output signal to a feedback analog signal; and determining a difference between the analog signal and the feedback analog signal.

18. The method of claim 17, wherein the second clock signal is an inverse of the first second clock signal.

19. The method of claim 18, wherein the comparator output signal further comprises a plurality of comparator output signals, and wherein the reference voltage further comprises a plurality of reference voltages, and wherein the step of comparing further comprises comparing the integrated analog signal to each of the reference signals to generate the plurality of comparator output signals.

20. The method of claim 19, further comprising:

actuating a plurality of switched in synchronization with the second clock signal, wherein each switch is associated with at least one of the comparator output signals; and applying each of the comparator output signal to at least one of a plurality of current steering circuits.

\* \* \* \* \*